United States Patent [19]

Wong

[11] Patent Number: 5,081,371
[45] Date of Patent: Jan. 14, 1992

[54] INTEGRATED CHARGE PUMP CIRCUIT WITH BACK BIAS VOLTAGE REDUCTION

[75] Inventor: Stephen L. Wong, Scarsdale, N.Y.

[73] Assignee: U.S. Philips Corp., New York, N.Y.

[21] Appl. No.: 610,191

[22] Filed: Nov. 7, 1990

[51] Int. Cl.$^5$ .............................................. H03K 3/01
[52] U.S. Cl. ................................. 307/296.2; 323/314; 363/60
[58] Field of Search ...................... 307/296.2; 363/60; 323/313.4

[56]  References Cited

U.S. PATENT DOCUMENTS

| | | | |
|---|---|---|---|
| 4,513,212 | 4/1985 | Money | 307/296.2 |
| 4,559,548 | 12/1985 | Iizuka et al. | 307/296.2 |
| 4,647,956 | 3/1987 | Shrivastava et al. | 307/296.2 |
| 4,675,557 | 7/1987 | Huntington | 323/314 |
| 4,825,142 | 4/1989 | Wang | 307/296.2 |
| 4,839,787 | 6/1989 | Kojima et al. | 363/60 |

Primary Examiner—Stanley D. Miller
Assistant Examiner—Andrew Sanders
Attorney, Agent, or Firm—Steven R. Biren

[57] ABSTRACT

An integrated charge pump circuit with back bias voltage reduction includes one or more diode type voltage-multiplier stages, with each stage having a diode-connected NMOS transistor in place of the conventionally-used p-n junction diode. The transistors are formed within a P-type well, which forms the back gate of each transistor within the well, and the transistor threshold voltages are dependent on the potential of the P-type well. Performance of the charge pump circuit using NMOS transistors is enhanced by the use of a bias circuit which generates a bias voltage as a function of the output voltage generated by the charge pump circuit, and applies this bias voltage to the P-type well to minimize the back-body effects of the NMOS transistors. The bias circuit thus permits the construction of an integrated charge pump circuit with significantly lower MOS diode voltage drops than would otherwise be possible.

4 Claims, 3 Drawing Sheets

INTEGRATED CHARGE PUMP CIRCUIT WITH BACK BIAS VOLTAGE REDUCTION

BACKGROUND OF THE INVENTION

The invention relates generally to voltage multiplier circuits, and relates more specifically to an integrated charge pump circuit with back bias voltage reduction.

Conventional charge pump circuits, such as those shown, for example, in FIG. 1 of this application or in FIG. 1 of U.S. Pat. No. 4,439,692, typically employ a plurality of series-connected diodes having an input terminal, an output terminal and one or more intermediate terminals, with each intermediate terminal being fed by a capacitively-coupled driver. Since the purpose of this circuit is to provide a voltage multiplication, the series-connected diodes in the charge-pump circuit must withstand voltages which exceed the normal power supply voltage range. When a charge pump circuit is required in MOS devices fabricated using standard MOS process technology, it becomes difficult to isolate the relatively high-voltage p-n junctions of these diodes, and additional process steps are usually necessary.

One possible solution to this problem, as shown in U.S. Pat. No. 4,439,692, is to use MOS-configured diodes (MOS transistors connected as diodes) for the conventional diodes of the prior art charge pump circuit. However, because these MOS-configured diodes typically have a larger diode drop (several volts as compared with the 0.7 volt of a conventional-p-n junction), the voltage-multiplying capability of the charge pump is substantially degraded. In other words, to achieve a given output voltage level from the charge pump, the number of cascaded stages in an all-MOS charge pump would be greater than the number of stages in the conventional p-n junction diode circuit. This results in a slower, more complex circuit which occupies additional silicon area. Thus, using prior-art technology, there are substantial drawbacks connected with the otherwise-desirable use of MOS technology in fabricating charge pump circuits.

There are two basic reasons for the relatively large diode drops in MOS-configured diodes. First, in MOS process technology, it is conventional to use a threshold-implant step to force the threshold voltage to between about 1 and 2 volts. Thus, for example, in U.S. Pat. No. 4,439,692, all of the transistors in the charge pump circuit 18 in FIG. 3 are designated as "H" (hard) transistors. In this context, a "hard" transistor is deemed to be one which has a substantially larger positive or negative threshold voltage than that of a so-called "soft" transistor. Thus, as shown in FIG. 4 of U.S. Pat. No. 4,439,692, so-called "hard" transistors may have a threshold voltage of about +1 volt for enhancement mode FET's and a threshold voltage of about −3 volts for depletion-mode FET's. In no case will these "hard" transistors have a relatively low threshold voltage, as the "hard" transistors are by definition those which have a more negative or more positive threshold voltage value.

Secondly, the threshold voltage is further increased by a large body effect caused by large source-to-substrate voltages in integrated circuits employing MOS transistors in the charge pump circuit. This effect occurs because the sources of the MOS transistors cannot be tied to the P-well substrate in which the transistors (typically NMOS devices) are fabricated because the sources must be allowed to rise above the supply voltage to permit the device to function as intended.

In order to create a relatively simple, efficient, fast and compact all-MOS charge pump circuit in an integrated circuit, these problem inherent in the prior-art structures must be overcome.

SUMMARY OF THE INVENTION

It is therefore an object of the invention to provide an integrated charge pump circuit which improves efficiency, speed, simplicity and compactness as compared to existing circuits.

In accordance with the invention, this object is achieved by a new integrated charge pump circuit having at least one diode type voltage-multiplier stage incorporating a diode-configured NMOS transistor fabricated in a P-type well which surrounds the NMOS transistor and forms its back gate. The improved physical and operational characteristics of the invention are achieved by making the NMOS transistor a relatively low-threshold transistor, and by using a bias circuit to generate a bias voltage which is less than the back bias voltage generated by the charge pump circuit. This bias circuit is advantageous in that it allows the P-type well to be biased at its highest possible potential without forward biasing any P-type well to bulk or P-type well to source junction. In this manner, the voltage difference between the source of the NMOS transistors and the P-type well can be minimized. This reduces the back bias voltage which further reduces the threshold of the NMOS transistors to result in a structure which offers performance in an all-MOS charge pump which approaches that of prior-art p-n junction diode circuits.

In a preferred embodiment of the invention, the threshold of the diode-configured transistors is selected to be relatively low (less than one voltage at zero back-body bias).

The bias circuit used to generate the bias voltage in the charge pump circuit may advantageously be composed of a further NMOS transistor connected as a source follower, with its gate being connected to an output terminal of the charge pump circuit and its source being coupled, through a resistor, to the P-type well in which the back gates of the diode-connected MOS transistors are formed. This configuration allows the P-well to always be biased one gate-to-source voltage plus one resistor drop below the output terminal voltage of the charge pump when the output is less than the supply voltage, and biased just one resistor drop below the supply voltage when the output is above the supply voltage. The value of the resistor drop can be selected to secure the desired output voltage value. This bias circuit serves to minimize the back bias when the charge pump is ON, and prevents forward conduction from the P-well to the bulk junction when the charge pump is OFF. The invention may be more completely understood with reference to the following detailed description, to be read in conjunction with the accompanying drawing.

DESCRIPTION OF THE PREFERRED EMBODIMENTS

Figure 1:
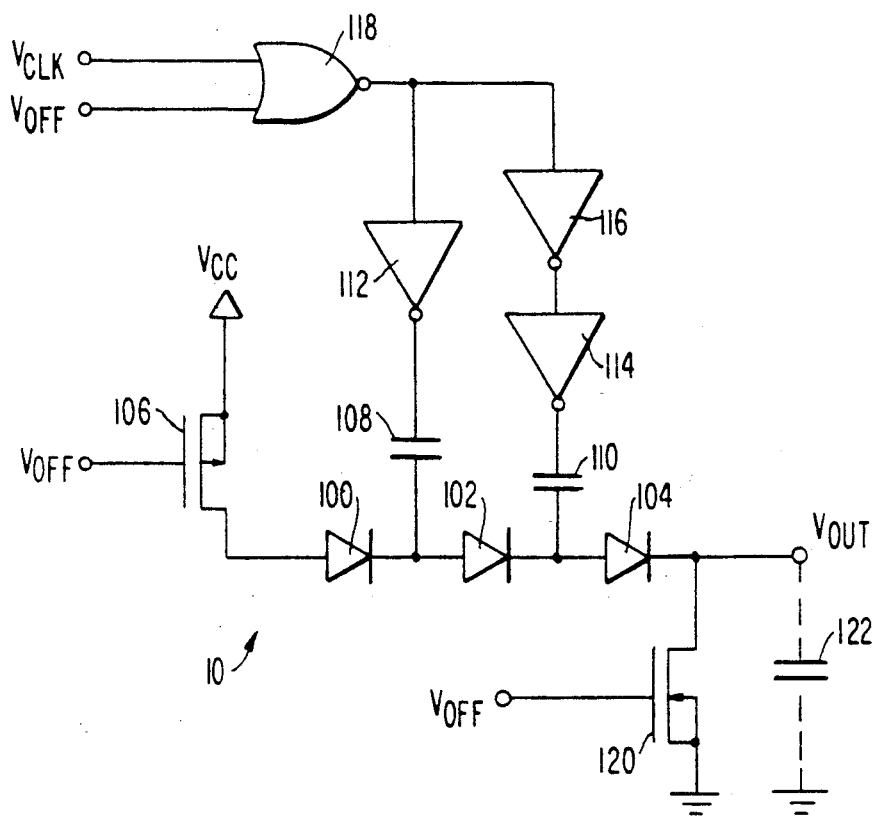
FIG. 1 shows a schematic circuit diagram of a priorart charge pump circuit.

FIG. 1 shows a conventional prior-art charge pump circuit 10 employing series-connected p-n junction diodes 100, 102 and 104. Power supply voltage $V_{cc}$ is fed to the anode of diode 100 through switching transistor 106 and the output voltage of the charge pump is generated at the cathode of diode 104, as shown by the symbol $V_{out}$. The intermediate points in the diode string are connected to capacitors 108 and 110, which are in turn driven by inverters 112, 114 and 116, and NOR gate 118 having inputs $V_{off}$ and $V_{clk}$. The circuit is turned ON and OFF by MOS transistors 106 and 120, which serve respectively to connect the anode of diode 100 to the power supply and disconnect the output terminal $V_{out}$ when the circuit is OFF, with the switching being accomplished as a function of the signal $V_{off}$ applied to the gates of transistors 106 and 120. The capacitance of the load connected to the terminal $V_{out}$ is shown schematically by a capacitor 122 connected between the output terminal and ground by a dotted line.

The prior-art circuit of FIG. 1 operates in a conventional manner similar to that of charge pump 18 in FIG. 1 of U.S. Pat. No. 4,439,692, and accordingly will not be described in detail. Briefly, however, the circuit operates as follows.

$V_{clk}$ is a high frequency clock signal (about 1 MHz) that feeds the input of inverters 112 and 116. $V_{off}$ is a control signal which, when high, disables the charge pump by blocking the $V_{clk}$ signal and by discharging the load capacitor 122. When $V_{off}$ is low, the $V_{clk}$ signal is allowed to pass through gate 118; transistor 106 turns on, and 120 turns off. In this state, the charge pump is on: node $V_{out}$ is first pulled to a value 3 diode drops below $V_{cc}$; alternating pulses that drive capacitors 108 and 110 at the $V_{clk}$ frequency effectively deliver charge packets that further drive up the voltage $V_{out}$ across capacitor 122. The unidirectional connection of the diodes (100, 102, 104) forms a voltage multiplying circuit that forces charged to flow only in the direction of the output.

With this scheme, it can be shown that the achievable steady state value of $V_{out}$ is $$V_{out} = V_{cc} + 2V_p - 3V_d$$

where $V_p$ is the output swing of inverting drivers 112 and 114, and $V_d$ is the diode drop across diode 100, 102, or 104. Thus it can be seen that $V_{out}$ is maximized if the diode drops are minimized.

In conventional charge pump circuits such as the one shown in FIG. 1, the node voltages at p-n junction diodes 100, 102 and 104 will exceed the supply voltage $V_{cc}$. When this type of circuit is implemented in an MOS structure, using standard MOS processed technology, it becomes difficult to isolate these high-voltage p-n junctions and additional process steps are usually required. One way to overcome these problems is to substitute MOS-configured diodes for the p-n junction diodes in the charge pump circuit, as shown for example in U.S. Pat. No. 4,439,692. However, because MOS transistors typically have larger diode drops (several volts as compared to 0.7 volts for a typical p-n junction), the voltage-multiplying capability of the charge pump circuit is substantially degraded. To achieve a given output voltage from the charge pump, the number of cascaded stages would have to be increased when using MOS transistors instead of p-n junction diodes. This has a very adverse affect on the speed of operation of the circuit, and requires additional silicon area as well.

The main reason for this relatively large MOS diode drop, and the resulting degradation in performance, is that the source of the MOS devices in the charge pump cannot be tied to the P-well substrate because the source must be allowed to rise above the supply voltage during operation. This problem, present in prior-art MOS charge pump circuits such as those disclosed in U.S. Pat. No. 4,439,692, results in larger, slower and less efficient implementation of charge pump circuitry.

Figure 2:
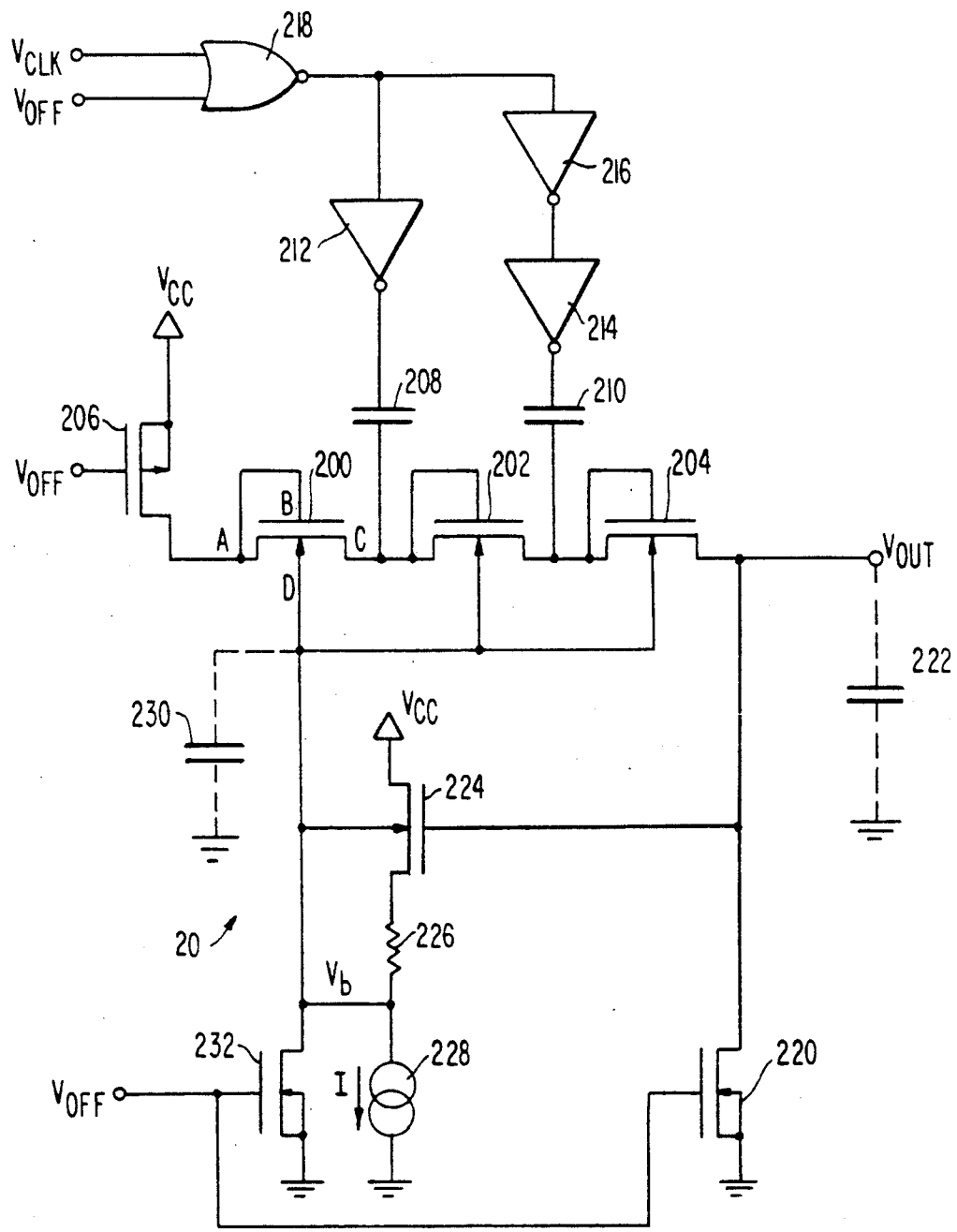
FIG. 2 shows a schematic circuit diagram of an all-MOS charge pump circuit in accordance with the invention.

FIG. 2 shows an improved charge pump circuit 20 in accordance with the invention, in which the aforementioned problem is largely eliminated, thus resulting in a faster, smaller and thus more efficient all-MOS charge pump circuit implementation. It should be noted that while a two-stage charge pump circuit is shown in FIG. 2, charge pump circuits in accordance with the invention can also be fabricated with only one stage, or with more than two stages. Also, for clarity, components in FIG. 2 having counterparts in FIG. 1 are provided with reference numerals having the last two digits the same as those of the corresponding components in FIG. 1.

In FIG. 2, the basic charge-pump circuit with its capacitively-coupled drivers (shown in the top portion of the figure) is the same as that of FIG. 1, except that the p-n junction diodes 100, 102 and 104 have been replaced by diode-connected MOS transistors 200, 202 and 204, respectively. In accordance with the invention, and contrary to the teaching of the prior art, these transistors can advantageously be low threshold unimplanted NMOS transistors, with a threshold voltage of less than one volt. Such transistors can be easily fabricated without using additional masks, in a double-poly process, by forming the gates of the transistors with a poly-layer that is provided before the threshold implant, thereby effectively shielding the implant from the channel.

Figure 3:
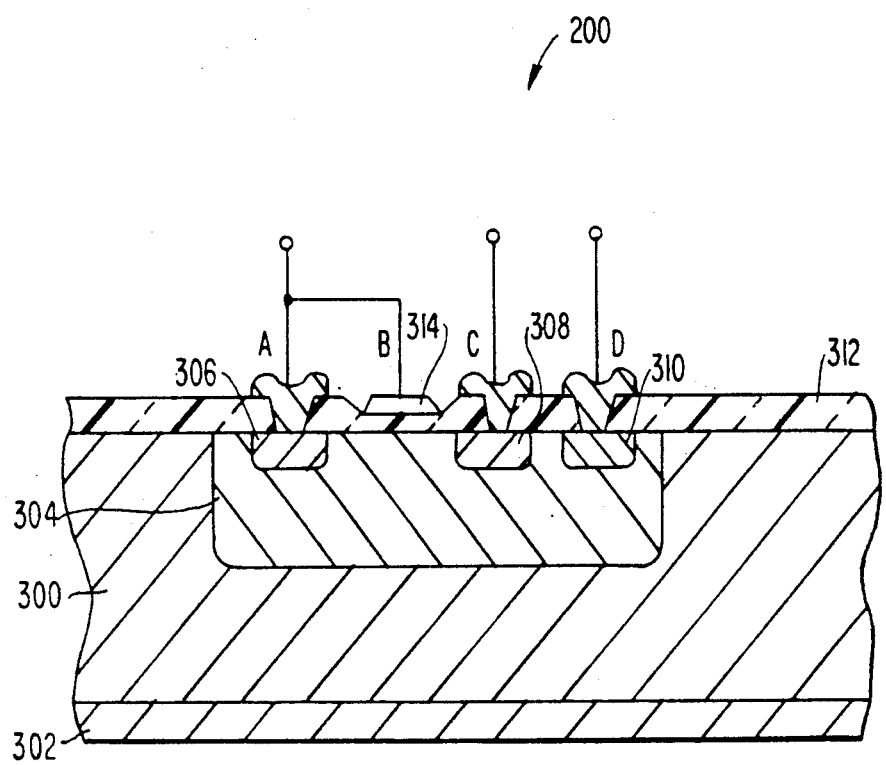
FIG. 3 shows a simplified cross section of a semiconductor device that is used in the integrated charge pump circuit in accordance with the invention.

Additionally, a new bias circuit, shown in the lower portion of FIG. 2, provides a reduced back-bias voltage for the P-well in which the diode-connected MOS transistors 200, 202 and 204 are fabricated, when the charge pump is ON. Additionally, this bias circuit prevents forward conduction in the P-well to bulk junction when the charge pump is OFF. Physically, the back gate terminals of the diodes can be either the individual p-wells of the diodes, as shown in FIG. 3, electrically tied together, or they can be one common p-well surrounding all three diodes. By way of example, FIG. 3 shows a simplified cross-section of a representative diode-connected transistor, here transistor 200 of FIG. 2. In transistor 200, a substrate 300, here of n-type conductivity, is provided with a highly-doped n type contact layer 302 and a p type well 304. Drain and source regions 306 and 308 of n type conductivity are provided in the well 304, along with a p type back-gate contact 310. An insulating layer 312, typically of silicon dioxide, is provided over the top surface of the device, and is provided with apertures for contacting the drain, source and back gate contact. A gate electrode 314 is provided over a portion of the insulating layer 312 having reduced thickness, and the gate electrode is connected to drain region 306. For clarity, corresponding terminals A, B, C and D of transistor 200 are shown in both FIG. 2 and FIG. 3. Alternatively, as noted above, all of the diode-connected transistors can be fabricated in a single p type well.

In the circuit of FIG. 2, the output voltage $V_{out}$ is taken from the output region of the device and is provided to the gate of an additional MOS transistor 224 which is connected in a source follower configuration with its channel connected between the supply voltage $V_{cc}$ and one end of a resistor 226. The other end of resistor 226 is connected to one terminal of a current source 228, the other terminal of which is connected to ground. The output of the bias circuit is taken at the junction between the resistor 226 and the current source 228, and the bias voltage developed at this point is designated as $V_b$. The bias voltage $V_b$ is then applied to the back gates of transistors 200, 202, 204, and 224 within the P-well, with capacitor 230, shown in dotted lines in FIG. 2, representing the capacitance of the P-well. Finally, an additional transistor 232 is provided to discharge the bias voltage to ground when the charge pump is turned OFF, while the charge pump output voltage $V_{out}$ is discharged to ground by transistor 220.

In each phase of operation, it is important that the p-well potential of the MOS diodes remain below the $V_{cc}$ potential, and always be lower than the lowest source of drain node potential of these transistors, because otherwise parasitic p-n junctions can be activated that can result in destructive latch-up of the circuit. AT the same time, it is important that the p-well potential be as high as possible in order to minimize the back body effect, and thus the threshold voltages, of these diodes. The bias circuit shown in FIG. 2 allows the p-well potential to be biased at least one gate-to-source voltage below the lowest source potential of the diodes when $V_{out}$ is still below $V_{cc}$ (during the transient charging phase of the output), and be biased at about $V_{cc}$ when $V_{out}$ is above $V_{cc}$ (during steady state).

The bias voltages can be further reduced by adding an optional resistive drop via resistor 22 so that the amount of body effect, and thus the threshold voltage, of the MOS diode can be tailored to realize an exact value of the output at steady state.

The bias circuit receives a voltage $V_{out}$ at the gate of source-follower transistor 224, and generates a bias voltage $V_b$ which is roughly equal to $V_{cc} - I_{228} \times R_{226}$. Thus, the bias voltage can be precisely controlled in order to optimize the diode drops across the MOS-connected transistors 200, 202 and 204. When the charge pump is turned OFF, transistors 220 and 232 are activated by the voltage $V_{off}$, thereby discharging both $V_{out}$ and $V_b$ to ground. It should be noted that if the particular circuit application does not require the bias voltage to be well controlled, then the value of resistor 226 can be set to zero without sacrificing the benefit to be derived from the invention.

In order to insure that $V_{out}$ will not discharge faster than $V_b$, which might forward bias the P-well to the output region junction of transistor 204, the width-to-length ratio W/L of transistors 220 and 232 can be proportioned in accordance with the ratio of the load capacitance 222 to the P-well capacitance 230.

While the invention has been particularly shown and described with reference to a preferred embodiment, it will be understood by those skilled in the art that various changes in form and detail, such as using a charge pump with a different number of stages, or using different polarity devices may be made without departing from the spirit and scope of the invention.

What is claimed is:

1. An integrated charge pump circuit comprising an output terminal for outputting a back bias voltage and at least one diode-type voltage-multiplier stage having a diode-configured NMOS transistor, a P-type well surrounding said NMOS transistor and forming the back gate thereof, said NMOS transistor being a low-threshold transistor, and a bias circuit for continuously generating a bias voltage as a function of and less than said back bias voltage to be applied to said P-type well and having an input connected to and having an input signal derived continuously from said output terminal and an output connected to and providing an output signal continuously to said P-type well.

2. An integrated charge pump circuit a claimed in claim 1, wherein the threshold voltage of said diode-configured transistor is less than about one volt at zero back gate bias.

3. An integrated charge pump circuit as claimed in claim 1, wherein said bias circuit comprises a further NMOS transistor connected as a source-follower, the input of said source follower being connected to said output terminal and the output of said source follower being coupled to said P-type well.

4. An integrated charge pump circuit as claimed in claim 3, further comprising a resistor and a current source connected in series, a first terminal of said resistor being connected to the source of said further NMOS transistor, a second terminal of said resistor being connected to a first terminal of said current source and forming the output of said source follower, a second terminal of said current source being connected to ground, and the drain of said further NMOS transistor being connected in operation to a source of voltage.

* * * * *